US009374065B2

(12) United States Patent
Sato (10) Patent No.: US 9,374,065 B2
(45) Date of Patent: Jun. 21, 2016

(54) VARIABLE INDUCTOR CIRCUIT AND HIGH FREQUENCY CIRCUIT

(71) Applicant: FUJITSU LIMITED, Kawasaki-shi, Kanagawa (JP)

(72) Inventor: Masaru Sato, Isehara (JP)

(73) Assignee: FUJITSU LIMITED, Kawasaki (JP)

(*) Notice: Subject to any disclaimer, the term of this patent is extended or adjusted under 35 U.S.C. 154(b) by 110 days.

(21) Appl. No.: 14/273,990

(22) Filed: May 9, 2014

(65) Prior Publication Data

US 2014/0368290 A1 Dec. 18, 2014

(30) Foreign Application Priority Data

Jun. 14, 2013 (JP) ................. 2013-125291

(51) Int. Cl.
*H03H 11/28* (2006.01)
*H03F 1/56* (2006.01)
*H03H 11/48* (2006.01)

(52) U.S. Cl.
CPC ............... *H03H 11/28* (2013.01); *H03F 1/565* (2013.01); *H03H 11/48* (2013.01)

(58) Field of Classification Search
CPC ..... H03H 11/28; H03H 11/486; H03H 11/48; H03F 1/565
USPC .......................................................... 333/32
See application file for complete search history.

(56) References Cited

U.S. PATENT DOCUMENTS

| 2004/0227573 | A1 | 11/2004 | Soda | |
| 2005/0059375 | A1* | 3/2005 | Abe | H03B 5/326 455/264 |
| 2006/0197617 | A1* | 9/2006 | Mukhopadhy | H03B 5/1231 331/76 |
| 2007/0008034 | A1 | 1/2007 | Tayrani | |
| 2008/0111632 | A1* | 5/2008 | Gong | H03F 1/223 330/310 |
| 2012/0256710 | A1* | 10/2012 | Chen | H01P 7/088 333/235 |

FOREIGN PATENT DOCUMENTS

| JP | 57-037808 | A | 3/1982 |
| JP | H08-181571 | | 7/1996 |
| JP | 2000-101393 | A | 4/2000 |
| JP | 2004-343373 | A1 | 12/2004 |
| JP | 2007-325217 | A | 12/2007 |

(Continued)

OTHER PUBLICATIONS

El Khoury S: "The Design of Active Floating Positive and Negative Inductors in MMIC Technology", IEEE Microwave and Guided Wave Letters, IEEE Inc, New York, US, vol. 5, No. 10, Oct. 1, 1995, pp. 321-323, XP000525038.

(Continued)

*Primary Examiner* — Stephen E Jones
*Assistant Examiner* — Scott S Outten
(74) *Attorney, Agent, or Firm* — Kratz, Quintos & Hanson, LLP (57) ABSTRACT

A first transistor and a second transistor cascade-connected, a wiring which connects a drain of the first transistor and a gate of the second transistor, a capacitor whose one terminal is connected between the first transistor and the second transistor cascade-connected and whose other terminal is grounded, and a control circuit are included. The control circuit adjusts an inductance value by controlling a capacitance value of the capacitor or gate voltage of the first transistor or the second transistor.

7 Claims, 9 Drawing Sheets

VARIABLE INDUCTOR CIRCUIT 1

(56) References Cited

FOREIGN PATENT DOCUMENTS

| JP | 2012-165435 A1 | 8/2012 |
|---|---|---|
| KR | 20100099873 A | 9/2010 |

OTHER PUBLICATIONS

EESR issued on Feb. 10, 2015 for corresponding European Application No. 14168776.4.

Masaaki Soda et al: "Low-Voltage Operational Active Inductor for LNA Circuit", IEICE Transactions on Fundamentals of Electronics, Communications and Computer Sciences, Engineering Sciences Society, Tokyo, JP, vol. E93A, No. 12, Dec. 1, 2010, pp. 2609-2615, XP001559615.

Y.H. Yu, et al., "A Compact Wideband CMOS Low Noise Amplifier with Grain Flatness Enhancement;" IEEE Journal of Solid-State Circuits; vol. 45; No. 3; Mar. 2010; pp. 502-509 (8 Sheets)/p. 2 of specification.

* cited by examiner

VARIABLE INDUCTOR CIRCUIT AND HIGH FREQUENCY CIRCUIT

CROSS-REFERENCE TO RELATED APPLICATION

This application is based upon and claims the benefit of priority of the prior Japanese Patent Application No. 2013-125291, filed on Jun. 14, 2013, the entire contents of which are incorporated herein by reference.

FIELD

The embodiments discussed herein are related to a variable inductor circuit and a high frequency circuit.

BACKGROUND

High frequency circuits used for radio communication and the like include matching circuits for realizing high gain at operating frequencies. The addition of a matching circuit enables impedance matching between a transistor and a load, so power reflection does not occur between them. As a result, good characteristics are obtained (in the case of an amplifier, high gain is obtained).

In addition to capacitors and resistors, matching circuits include transmission lines which realize inductance components. However, if a transmission line is used, it is not easy to adjust an inductance value (because an adjustment of an inductance value requires, for example, the process of performing design and trial manufacture again). Accordingly, a change in operating frequency causes a deterioration in performance.

Therefore, variable inductor circuits which can electrically adjust inductance values (which may also be referred to as active inductors) are used.

Japanese Laid-open Patent Publication No. 2012-165435
Japanese Laid-open Patent Publication No. 08-181571
Y. Yu et al., "A Compact Wideband CMOS Low Noise Amplifier With Gain Flatness Enhancement", IEEE JOURNAL OF SOLID-STATE CIRCUITS, Vol. 45, No. 3, pp. 502-509, 2010

With conventional variable inductor circuits, however, resonance occurs at high frequencies and it is difficult to adjust inductance values at high frequencies. With the conventional variable inductor circuits, for example, resonance occurs at frequencies higher than and equal to 10 GHz. It is difficult to realize a variable inductor circuit which operates even at comparatively high frequencies like those of millimeter waves higher than and equal to 30 GHz.

SUMMARY

According to an aspect, there is provided a variable inductor circuit including a first transistor and a second transistor cascade-connected, a wiring which connects a drain of the first transistor and a gate of the second transistor, a capacitor whose one terminal is connected between the first transistor and the second transistor cascade-connected and whose other terminal is grounded, and a control circuit which adjusts an inductance value by controlling a capacitance value of the capacitor or gate voltage of the first transistor or the second transistor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Embodiments will now be described with reference to the accompanying drawings, wherein like reference numerals refer to like elements throughout.

First Embodiment

Figure 1:
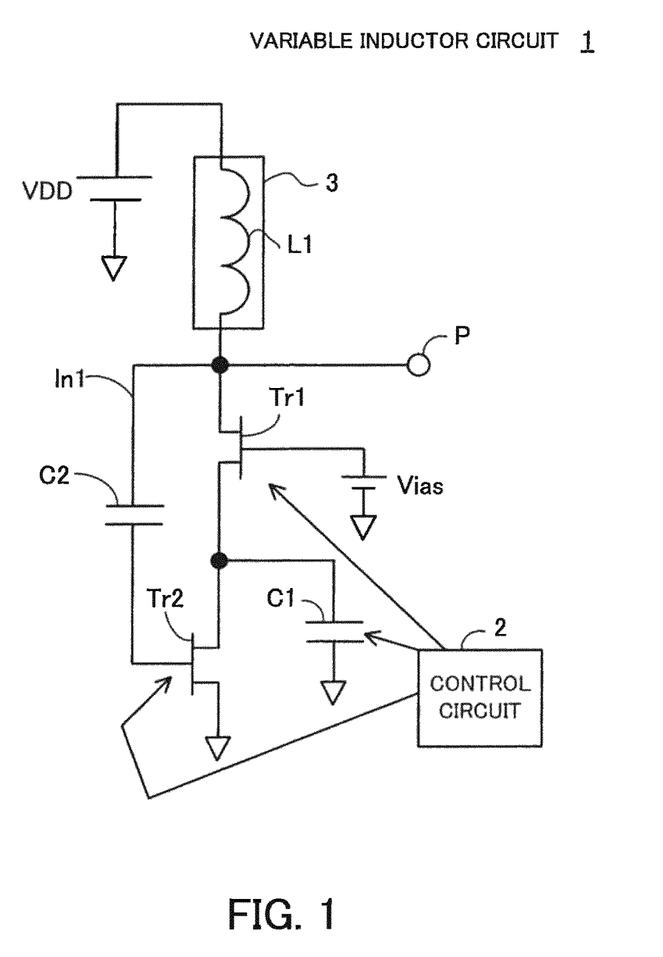
FIG. 1 illustrates an example of a variable inductor circuit.

FIG. 1 illustrates an example of a variable inductor circuit.
A variable inductor circuit 1 is used as a part of a matching circuit included in a high frequency circuit used for radio communication or the like. The high frequency circuit is an amplifying circuit, a frequency mixer circuit, or the like. In this specification description will be given with comparatively high frequencies higher than and equal to 30 GHz as high frequencies. However, high frequencies are not limited to frequencies in particular higher than and equal to 30 GHz.

The variable inductor circuit 1 includes transistors Tr1 and Tr2, capacitors C1 and C2, a control circuit 2, and a signal propagation suppressor 3. In the following description it is assumed that the transistors Tr1 and Tr2 are n-channel MOSFETs (Metal-Oxide Semiconductor Field Effect Transistors). An example of a variable inductor circuit using p-channel MOSFETs will be described later.

The transistors Tr1 and Tr2 are cascade-connected. That is to say, a source of the transistor Tr1 is connected to a drain of the transistor Tr2. Power supply voltage VDD is applied to a drain of the transistor Tr1 via the signal propagation suppressor 3. Furthermore, a terminal (or a node) P is connected to the drain of the transistor Tr1. The terminal P is connected to, for example, a node in a high frequency circuit described later. Direct-current bias voltage Vias is applied to a gate of the transistor Tr1.

The signal propagation suppressor 3 which suppresses the propagation of a high-frequency signal is placed between the drain of the transistor Tr1 which the high-frequency signal is inputted to or outputted from and power supply. This curbs the influence of the high-frequency signal on the power supply. A transmission line whose length is one fourth of a wavelength of the high-frequency signal may be used as the signal propagation suppressor 3. However, in order to accommodate signals at different frequencies, it is desirable to use, for example, a RF (Radio Frequency) choke L1 as illustrated in FIG. 1. The RF choke L1 suppresses the propagation of signals at frequencies higher than a certain frequency.

In addition, the variable inductor circuit 1 includes a wiring ln1 which connects the drain of the transistor Tr1 and a gate of the transistor Tr2. In the example of FIG. 1, the drain of the transistor Tr1 and the gate of the transistor Tr2 are connected by the wiring ln1 via the capacitor C2 used for removing direct-current voltage. However, the capacitor C2 may not be used.

One terminal of the capacitor C1 is connected between the transistors Tr1 and Tr2 cascade-connected and the other terminal of the capacitor C1 is grounded.

The control circuit 2 controls a capacitance value of the capacitor C1 or gate voltage of the transistor Tr1 or Tr2.

By connecting the transistors Tr1 and Tr2 and the capacitor C1 in the above way, the variable inductor circuit 1 has a function as an inductor circuit. Furthermore, by controlling a capacitance value of the capacitor C1 or gate voltage of the transistor Tr1 or Tr2, an inductance value can be changed. The reason for this is as follows.

Figure 2:
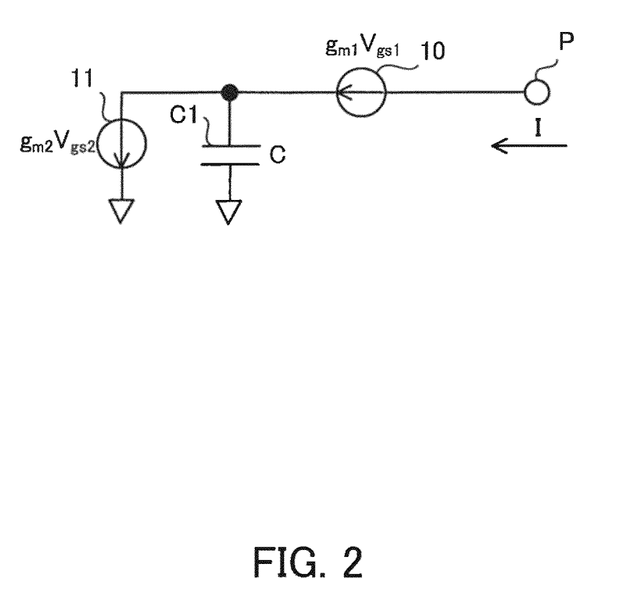
FIG. 2 illustrates an example of an equivalent circuit of the variable inductor circuit illustrated in FIG. 1.

FIG. 2 illustrates an example of an equivalent circuit of the variable inductor circuit illustrated in FIG. 1.

FIG. 2 illustrates an example of an equivalent circuit of a circuit including the transistors Tr1 and Tr2 and the capacitor C1 illustrated in FIG. 1. The transistor Tr1 is replaced with a current source 10 and the transistor Tr2 is replaced with a current source 11. $g_{m1}$ and $g_{m2}$ indicate mutual conductance of the transistors Tr1 and Tr2, respectively, and are parameters indicative of amplification degrees. $V_{gs1}$ and $V_{gs2}$ indicate gate-source voltage of the transistors Tr1 and Tr2, respectively, and are influenced by gate-source parasitic capacitance.

Current I which flows in from the terminal P is expressed as $$I = g_{m1} V_{gs1} \quad (1)$$

Furthermore, the following relationship holds in the equivalent circuit illustrated in FIG. 2.

$$g_{m1} V_{gs1} = g_{m2} V_{gs2} + j\omega C (-V_{gs1}) \quad (2)$$

where C is a capacitance value of the capacitor C1 and ω is angular velocity of the current I.

Equation (2) can be changed into $$(g_{m1} + j\omega C) V_{gs1} = g_{m2} V_{gs2} \quad (3)$$

From equations (1) and (3), the current I is expressed as $$I = g_{m1}(g_{m2} V_{gs2}/(g_{m1} + j\omega C)) \quad (4)$$

By the way, impedance Z from the terminal P of the equivalent circuit is expressed as $$Z = V_{gs2}/I \quad (5)$$

When equation (4) is substituted in equation (5), $$Z = (1/g_{m2}) + (j\omega C/g_{m1} g_{m2}) \quad (6)$$

An imaginary part of the impedance Z corresponds to an inductance value L, so an inductance value L is equivalently expressed as $$L = C/g_{m1} g_{m2} \quad (7)$$

Therefore, the inductance value L can be changed by adjusting the capacitance value C of the capacitor C1 or the mutual conductance $g_{m1}$ or $g_{m2}$ of the transistor Tr1 or Tr2.

If the inductance value L is changed by adjusting the capacitance value C, then the capacitor C1 is considered as a variable capacitance element and the control circuit 2 adjusts bias voltage (control voltage) applied to the variable capacitance element. Alternatively, the control circuit 2 may change the inductance value L by adjusting gate voltage of the transistor Tr1 or Tr2 and thus adjusting the mutual conductance $g_{m1}$ or $g_{m2}$.

Furthermore, as stated above, the variable inductor circuit 1 functions as an inductor circuit by the two transistors Tr1 and Tr2, that is to say, by a small number of transistors. As a result, parasitic capacitance (gate-source capacitance) can be reduced. If parasitic capacitance is high, the inductance value L is large at high frequencies and resonance occurs. With the variable inductor circuit 1 according to the first embodiment, however, parasitic capacitance is low, so resonance is prevented. Therefore, it is possible to make the variable inductor circuit 1 function as an inductor circuit even at comparatively high frequencies.

Figure 3:
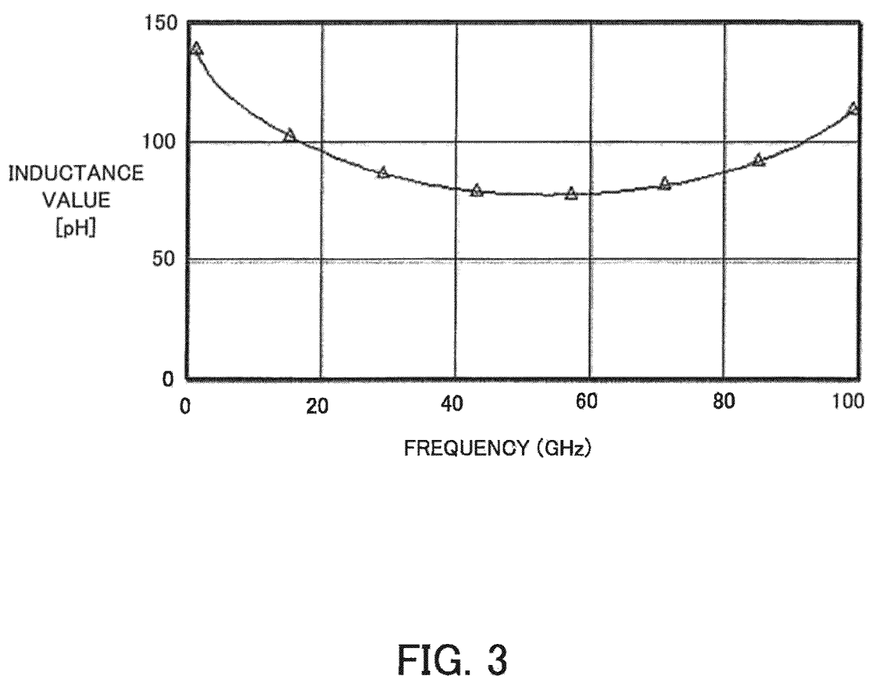
FIG. 3 indicates an example of a circuit simulation result indicative of the relationship between a frequency and an inductance value.

FIG. 3 indicates an example of a circuit simulation result indicative of the relationship between a frequency and an inductance value. In FIG. 3, a horizontal axis indicates a frequency (GHz) and a vertical axis indicates an inductance value (pH).

The following transistors are used as the transistors Tr1 and Tr2 included in the variable inductor circuit 1 illustrated in FIG. 1 for doing a circuit simulation. The values of the mutual conductance $g_{m1}$ and $g_{m2}$ are 58 mS and gate-source capacitance (parasitic capacitance) is 20 fF. In addition, the capacitance value C of the capacitor C1 is 150 fF.

As can be seen from FIG. 3, the variable inductor circuit 1 functions as an inductor circuit even at a frequency of 100 GHz.

As has been described, the variable inductor circuit 1 according to the first embodiment functions as a variable inductor even at high frequencies like those of millimeter waves higher than and equal to 30 GHz.

Second Embodiment

Figure 4:
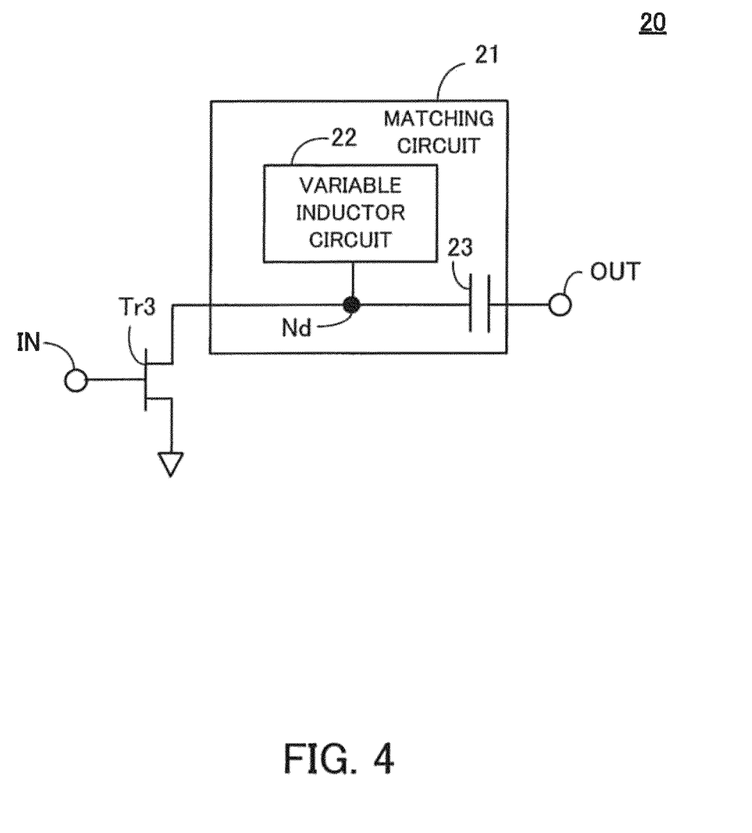
FIG. 4 illustrates an example of a high frequency circuit.

FIG. 4 illustrates an example of a high frequency circuit.

A high frequency circuit 20 is connected to a transistor Tr3 which receives a high-frequency signal, and includes a matching circuit 21 which performs impedance matching. The transistor Tr3 is, for example, an n-channel MOSFET. A high-frequency (millimeter-wave, for example) signal is inputted to a gate of the transistor Tr3 via an input terminal IN. A source of the transistor Tr3 is grounded and the matching circuit 21 is connected between a drain of the transistor Tr3 and an output terminal OUT. The transistor Tr3 may be a p-channel MOSFET.

The matching circuit 21 includes a variable inductor circuit 22 and a capacitor 23. The capacitor 23 is connected between the transistor Tr3 and the output terminal OUT. The variable inductor circuit 22 is connected to a node Nd between the transistor Tr3 and the capacitor 23.

Two examples of the variable inductor circuit 22 will now be described. A first example of the variable inductor circuit 22 will be referred to as a variable inductor circuit 22a and a second example of the variable inductor circuit 22 will be referred to as a variable inductor circuit 22b.

(Example 1 of Variable Inductor Circuit)

Figure 5:
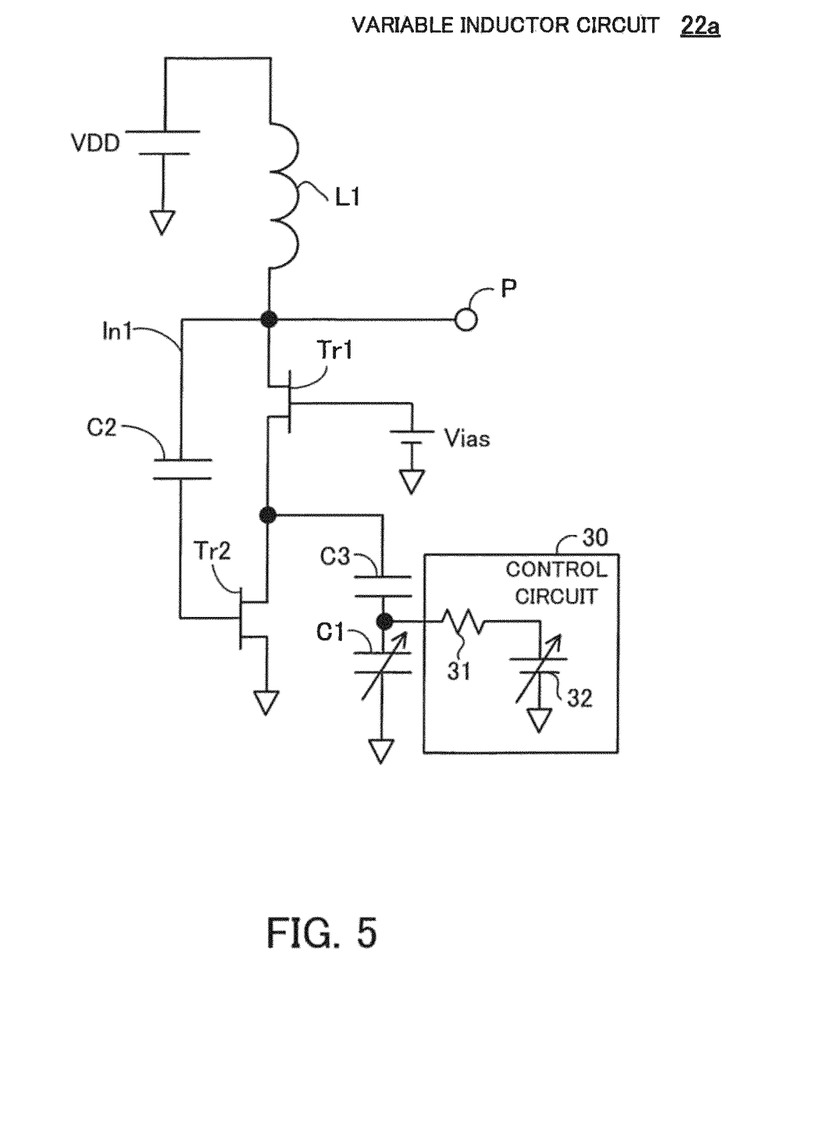
FIG. 5 illustrates a first example of a variable inductor circuit.

FIG. 5 illustrates a first example of the variable inductor circuit. Components in FIG. 5 which are the same as those included in the variable inductor circuit 1 illustrated in FIG. 1 are marked with the same numerals.

The variable inductor circuit 22a is almost the same as the variable inductor circuit 1. However, a control circuit 30 controls a capacitance value of a capacitor C1. The capacitor C1 is a variable capacitance element and is, for example, a varactor diode (variable capacitance diode). Furthermore, the capacitor C1 is connected between transistors Tr1 and Tr2 via a capacitor C3 used for removing direct-current voltage. In addition, a terminal P is connected to the node Nd of the matching circuit 21 illustrated in FIG. 4. Direct-current voltage is applied to the capacitor C1. Accordingly, the use of the capacitor C3 curbs the influence of this direct-current voltage on drain voltage of the transistor Tr2.

The control circuit 30 includes a resistor 31 and power supply 32. Control voltage generated by the power supply 32 is applied to the capacitor C1 via the resistor 31. A capacitance value of the capacitor C3 is significantly small compared with a capacitance value of the capacitor C1. Accordingly, a large part of a capacitance value of the whole of the capacitors C1 and C3 connected in series is the capacitance value of the capacitor C1. Therefore, the capacitance value C in equation (7) is determined on the basis of the capacitance value of the capacitor C1.

Figure 6:
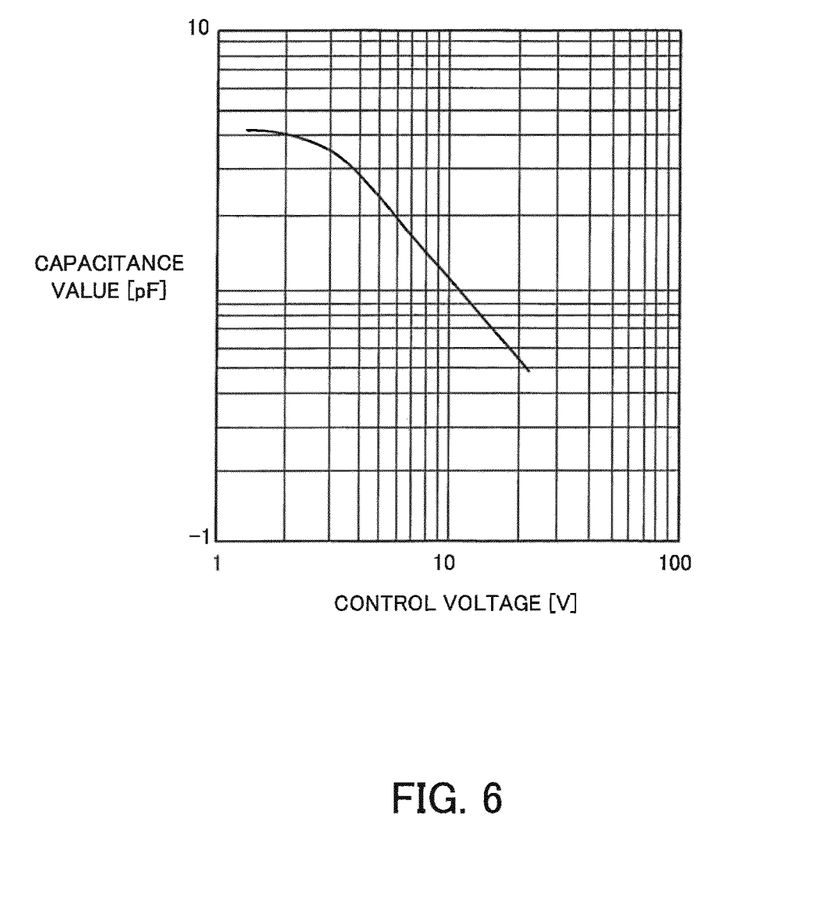
FIG. 6 indicates an example of the relationship between control voltage and a capacitance value of a capacitor C1 (varactor diode)

FIG. 6 indicates an example of the relationship between control voltage and the capacitance value of the capacitor C1 (varactor diode). In FIG. 6, a horizontal axis indicates control voltage (V) applied to the capacitor C1 and a vertical axis indicates the capacitance value (pF) of the capacitor C1.

As can be seen from FIG. 6, an increase in control voltage causes a decrease in the capacitance value of the capacitor C1 and a decrease in control voltage causes an increase in the capacitance value of the capacitor C1. From equation (7), a small inductance value is obtained by making a capacitance value small. Therefore, the power supply 32 increases control voltage. On the other hand, a large inductance value is obtained by making a capacitance value large. Therefore, the power supply 32 decreases control voltage.

With the variable inductor circuit 22a illustrated in FIG. 5, as has been described, an inductance value can be adjusted. As a result, if the variable inductor circuit 22a is used in the matching circuit 21 illustrated in FIG. 4, a matching frequency can be adjusted. Accordingly, applications which differ in frequency can be dealt with by the use of the same circuit.

Furthermore, as stated above, the variable inductor circuit 22a functions as an inductor circuit by the two transistors Tr1 and Tr2, that is to say, by a small number of transistors. As a result, parasitic capacitance can be reduced and resonance is prevented. Therefore, as indicated in FIG. 3, the variable inductor circuit 22a functions as an inductor circuit even at high frequencies.

In addition, with the variable inductor circuit 22a power supply is connected via a RF choke L1 to a drain of the transistor Tr1 connected to the terminal P, and power supply voltage VDD is applied to the drain of the transistor Tr1. The drain of the transistor Tr1 is connected to the transistor Tr3 of the high frequency circuit 20 via the terminal P, so bias voltage is supplied to the transistor Tr3. As a result, there is no need to add a bias supply circuit for the transistor Tr3. This checks an increase in circuit area.

(Example 2 of Variable Inductor Circuit)

Figure 7:
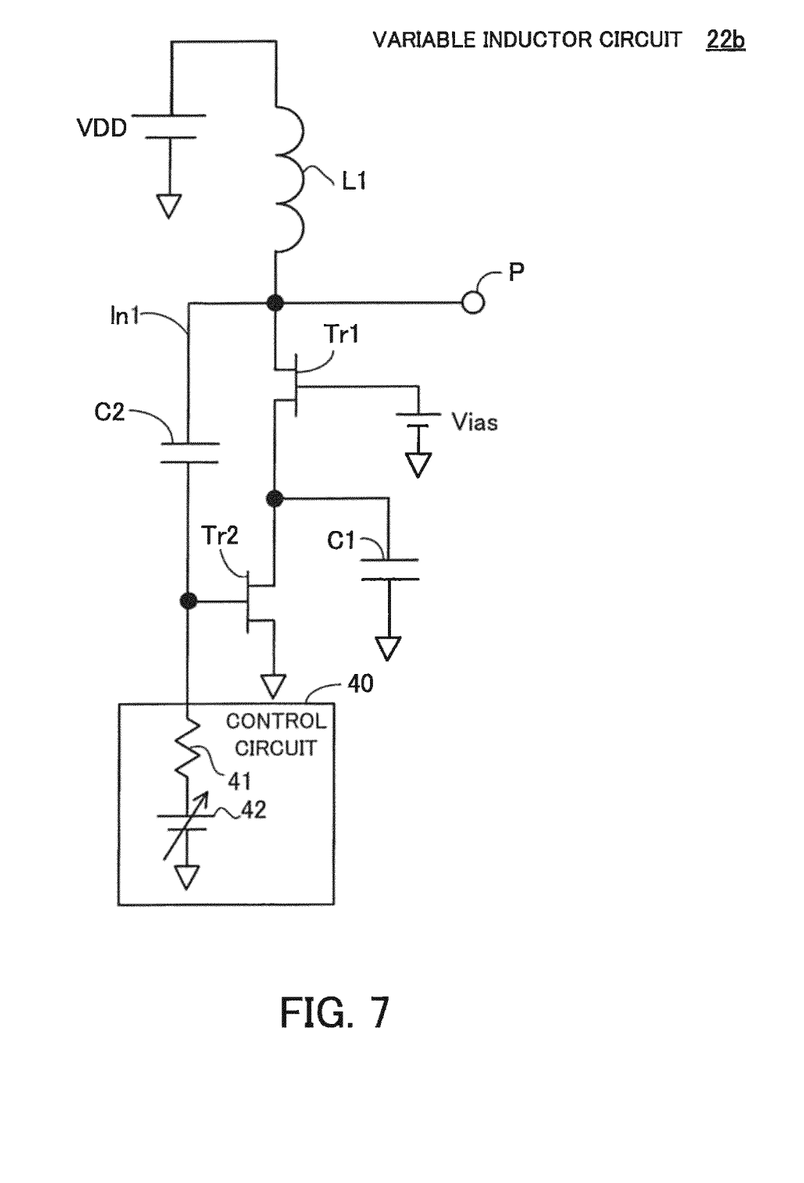
FIG. 7 illustrates a second example of a variable inductor circuit.

FIG. 7 illustrates a second example of the variable inductor circuit. Components in FIG. 7 which are the same as those included in the variable inductor circuit 1 illustrated in FIG. 1 are marked with the same numerals.

The variable inductor circuit 22b is almost the same as the variable inductor circuit 1. However, a control circuit 40 controls gate voltage of a transistor Tr2. In addition, a terminal P is connected to the node Nd of the matching circuit 21 illustrated in FIG. 4.

The control circuit 40 includes a resistor 41 and power supply 42. Control voltage generated by the power supply 42 is applied to a gate of the transistor Tr2 via the resistor 41. By adjusting gate voltage of the transistor Tr2, mutual conductance $g_{m2}$ of the transistor Tr2 changes. Accordingly, from equation (7), an inductance value L can be adjusted.

Figure 8:
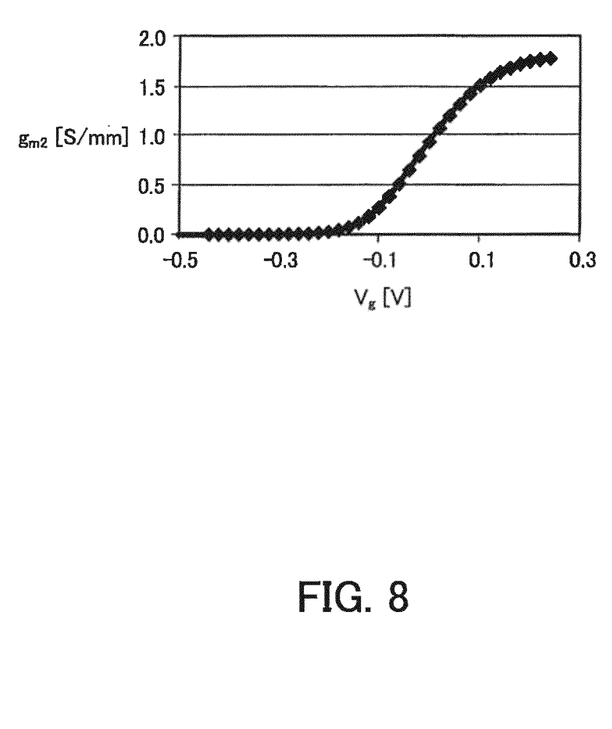
FIG. 8 indicates an example of the relationship between gate voltage and mutual conductance of a transistor.

FIG. 8 indicates an example of the relationship between gate voltage and mutual conductance of the transistor. In FIG. 8, a horizontal axis indicates gate voltage $V_g$ (V) and a vertical axis indicates the mutual conductance $g_{m2}$ (S/mm) of the transistor Tr2. In the example of FIG. 8, calculations are performed with gate width of the transistor Tr2 as 80 μm.

As can be seen from FIG. 8, an increase in the gate voltage $V_g$ causes an increase in the mutual conductance $g_{m2}$ and a decrease in the gate voltage $V_g$ causes a decrease in the mutual conductance $g_{m2}$. From equation (7), a small inductance value L is obtained by making the mutual conductance $g_{m2}$ large. Therefore, the power supply 42 increases the gate voltage $V_g$. On the other hand, a large inductance value L is obtained by making the mutual conductance $g_{m2}$ small. Therefore, the power supply 42 decreases the gate voltage $V_g$.

With the variable inductor circuit 22b illustrated in FIG. 7, as has been described, an inductance value L can also be adjusted. The same effect that is achieved by the variable inductor circuit 22a illustrated in FIG. 5 is obtained.

In the above example an inductance value L is adjusted by changing gate voltage of the transistor Tr2. However, gate voltage of the transistor Tr1 may be changed. When gate voltage of the transistor Tr1 is changed, mutual conductance $g_{m1}$ of the transistor Tr1 changes the same as the mutual conductance $g_{m2}$ indicated in FIG. 8 changes. Accordingly, an inductance value L is adjusted on the basis of equation (7).

By the way, in the above description the variable inductor circuits 22a and 22b each using the transistors Tr1 and Tr2, which are n-channel MOSFETs, are taken as examples. However, even if p-channel MOSFETs are used, a variable inductor circuit is realized by adopting the same structure. A variable inductor circuit using p-channel MOSFETs will now be described as a modification.

Modification

Figure 9:
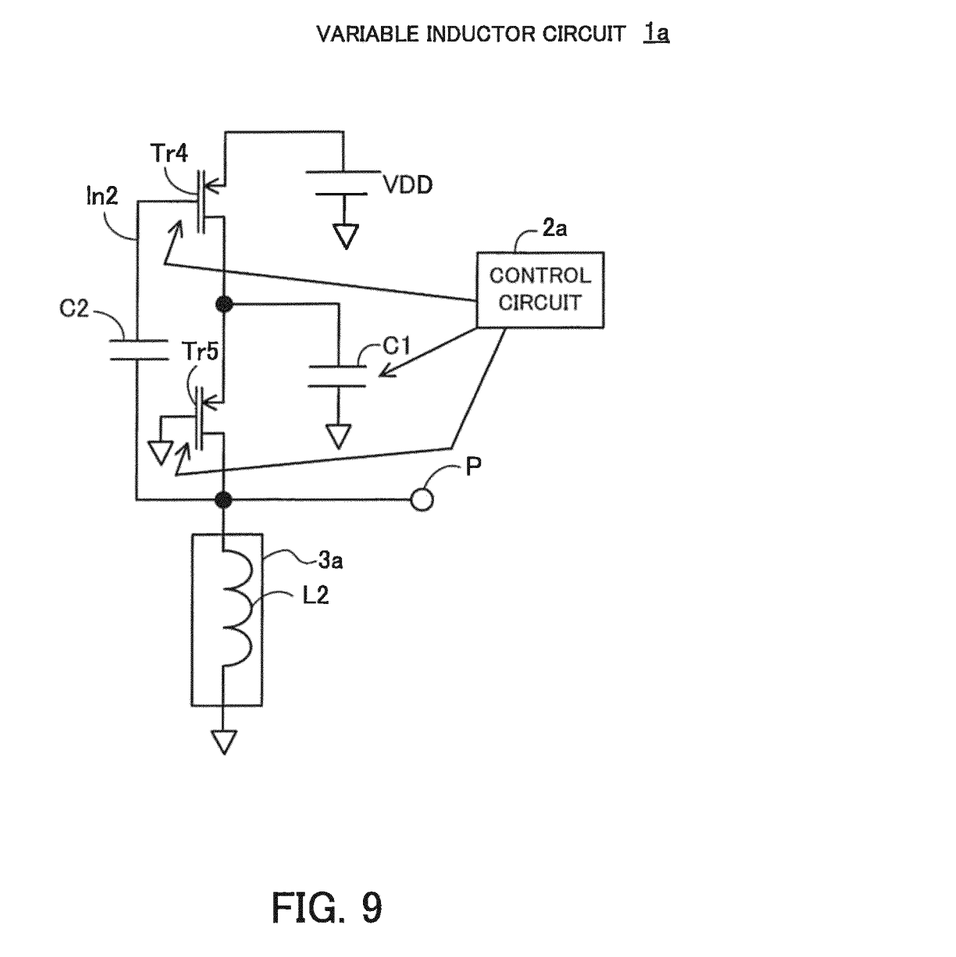
FIG. 9 illustrates an example of a variable inductor circuit using p-channel MOSFETs.

FIG. 9 illustrates an example of a variable inductor circuit using p-channel MOSFETs. Components in FIG. 9 which are the same as those included in the variable inductor circuit 1 illustrated in FIG. 1 are marked with the same numerals.

A variable inductor circuit 1a includes transistors Tr4 and Tr5 which are p-channel MOSFETs, a signal propagation suppressor 3a (RF choke L2), capacitors C1 and C2, and a control circuit 2a.

The transistors Tr4 and Tr5 are cascade-connected. That is to say, a drain of the transistor Tr4 is connected to a source of the transistor Tr5. Power supply voltage VDD is applied to a source of the transistor Tr4. The signal propagation suppressor 3a and a terminal (or a node) P are connected to a drain of the transistor Tr5. The terminal P is connected to, for example, the node Nd of the matching circuit 21 in the above high frequency circuit 20. A gate of the transistor Tr5 is grounded. The signal propagation suppressor 3a is grounded. A high-frequency signal is inputted to or outputted from the drain of the transistor Tr5 and the influence of the high-frequency signal on ground potential is curbed.

In addition, the variable inductor circuit 1a includes a wiring 1n2 which connects the drain of the transistor Tr5 and a gate of the transistor Tr4. In the example of FIG. 9, the drain of the transistor Tr5 and the gate of the transistor Tr4 are connected by the wiring 1n2 via the capacitor C2 used for removing direct-current voltage. However, the capacitor C2 may not be used.

One terminal of the capacitor C1 is connected between the transistors Tr4 and Tr5 cascade-connected and the other terminal of the capacitor C1 is grounded.

The control circuit 2a controls a capacitance value of the capacitor C1 or gate voltage of the transistor Tr4 or Tr5.

As has been described, even if p-channel MOSFETs are used, the transistors Tr4 and Tr5 and the capacitor C1 are connected in the manner illustrated in FIG. 9. By doing so, an inductance value L is expressed as $$L = C/g_{m4}g_{m5}$$

where C is a capacitance value of the capacitor C1 and $g_{m4}$ and $g_{m5}$ are mutual conductance of the transistors Tr4 and Tr5 respectively. This is the same with equation (7). That is to say, even if p-channel MOSFETs are used, the variable inductor circuit 1a functions as an inductor circuit.

Furthermore, the control circuit 2a changes a capacitance value of the capacitor C1. By doing so, an inductance value L is adjusted. In addition, the control circuit 2a changes gate voltage of the transistor Tr4 or Tr5. By doing so, the mutual conductance $g_{m4}$ or $g_{m5}$ of the transistor Tr4 or Tr5 changes and an inductance value L is adjusted.

Moreover, the variable inductor circuit 1a functions as an inductor circuit by the two transistors Tr4 and Tr5, that is to say, by a small number of transistors. As a result, parasitic capacitance can be reduced and resonance is prevented. Therefore, the variable inductor circuit 1a functions as an inductor circuit even at high frequencies.

The control circuit 30 illustrated in FIG. 5, the control circuit 40 illustrated in FIG. 7, or the like may be used as the control circuit 2a.

The variable inductor circuit and the high frequency circuit according to an aspect of the present invention have been described on the basis of the embodiments. However, these are simple examples and the present invention is not limited to the above description.

In the above description, for example, a case where an inductance value is adjusted by controlling gate voltage of a transistor and a case where an inductance value is adjusted by controlling a capacitance value of the capacitor C1 are described separately. However, both of them may be controlled at the same time to adjust an inductance value.

According to the disclosed variable inductor circuit and high frequency circuit, an inductance value can be adjusted even at comparatively high frequencies.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A variable inductor circuit, comprising:
a first transistor and a second transistor which are connected between a power supply and a ground, with a source of the first transistor being connected to a drain of the second transistor and with a gate of the first transistor being electrically disconnected from the second transistor, the gate of the first transistor being supplied with a bias voltage;
a wiring which connects a drain of the first transistor and a gate of the second transistor;
a capacitor whose one terminal is connected between the source of the first transistor and the drain of the second transistor and whose other terminal is grounded; and
a control circuit which adjusts an inductance value by controlling a capacitance value of the capacitor or a gate voltage of the first transistor or the second transistor.

2. The variable inductor circuit according to claim 1, wherein the drain of the first transistor which a signal is inputted to or outputted from is connected to the power supply or is grounded, via a signal propagation suppressor which suppresses propagation of the signal.

3. The variable inductor circuit according to claim 2, wherein the signal propagation suppressor is an RF choke.

4. The variable inductor circuit according to claim 1, wherein when the control circuit controls the gate voltage of the first transistor or the second transistor, mutual conductance of the first transistor or the second transistor changes and the inductance value is adjusted.

5. The variable inductor circuit according to claim 1, wherein the capacitor is a variable capacitance element and is connected between the source of the first transistor and the drain of the second transistor via another capacitor which suppresses direct-current voltage.

6. A high frequency circuit, comprising:
a first transistor which receives a signal; and
a matching circuit which is connected to the first transistor, which performs impedance matching, and which includes a variable inductor circuit, the variable inductor circuit including:
a second transistor and a third transistor which are connected between a power supply and a ground, with a source of the second transistor being connected to a drain of the third transistor and with a gate of the second transistor being electrically disconnected from the third transistor, the gate of the second transistor being supplied with a first bias voltage;
a wiring which connects a drain of the second transistor and a gate of the third transistor;
a capacitor whose one terminal is connected between the source of the second transistor and the drain of the third transistor and whose other terminal is grounded; and
a control circuit which adjusts an inductance value by controlling a capacitance value of the capacitor or a gate voltage of the second transistor or the third transistor.

7. The high frequency circuit according to claim 6, wherein:
the drain of the second transistor is connected to the power supply via a signal propagation suppressor which suppresses propagation of the signal, and is connected to the first transistor; and
a second bias voltage is supplied to the first transistor by the power supply.

* * * * *